United States Patent [19]
Ogino et al.

[11] Patent Number: 5,527,646
[45] Date of Patent: Jun. 18, 1996

[54] METHOD OF FORMING A MICRO STRUCTURE AND AN X-RAY MASK

[75] Inventors: Seiji Ogino; Toshiyuki Numazawa, both of Osaka, Japan

[73] Assignee: Sumitomo Electric Industries, Ltd., Osaka, Japan

[21] Appl. No.: 216,639

[22] Filed: Mar. 23, 1994

[30] Foreign Application Priority Data

Mar. 25, 1993 [JP] Japan .................. 5-066676

[51] Int. Cl.⁶ .................................................. G03F 9/00
[52] U.S. Cl. .................. 430/5; 430/8; 430/24; 430/326; 430/967
[58] Field of Search ............. 430/5, 324, 326, 430/8, 967; 264/25

[56] References Cited

U.S. PATENT DOCUMENTS

| | | | |
|---|---|---|---|
| 4,125,672 | 11/1978 | Kakuchi et al. | 428/421 |
| 5,298,367 | 3/1994 | Hoessel et al. | 430/324 |

FOREIGN PATENT DOCUMENTS

| | | |
|---|---|---|
| 0141335 | 5/1985 | European Pat. Off. . |
| 0187870 | 7/1986 | European Pat. Off. . |
| 277773 | 4/1990 | Germany . |

OTHER PUBLICATIONS

Nikkei Mechanical 1990. Nov. 26, pp. 72–79.
Kikai Sekkei vol. 3, No. 6 (May, 1991) pp. 26–28.
J. Electrochem., Soc., vol. 1126, No. 1 (1979) pp. 154–161.

Primary Examiner—S. Rosasco
Attorney, Agent, or Firm—W. G. Fasse; W. F. Fasse

[57] ABSTRACT

A method of forming a microstructure having a higher aspect ratio by using a general purpose synchrotron orbital radiation apparatus is provided. A resist layer mainly including a copolymer of methylmethacrylate and methacrylic acid is formed relatively thick on a substrate. Lithography by synchrotron orbital radiation is carried out on the resist layer, to form a resist pattern. By carrying out normal electroplating, electro-forming or the like in accordance with the resist pattern, a microstructure having a high aspect ratio is obtained.

22 Claims, 12 Drawing Sheets

5,527,646

METHOD OF FORMING A MICRO STRUCTURE AND AN X-RAY MASK

BACKGROUND OF THE INVENTION

1. Field of the Invention

The present invention relates to a method of forming a microstructure and, more specifically, to an improvement in a method of forming microstructures such as the LIGA method, an improvement in the method of forming microstructures applying patterning techniques commonly used for semiconductor processing and the like, and to an X-ray mask.

2. Description of the Background Art

Recently, microprocessing techniques for forming highly miniaturized structures by using methods known for manufacturing semiconductor integrated circuit devices have been studied intensively. Especially the LIGA (Lithograph Galvanformung und Abformung) method for forming microstructures having a high aspect ratio is attracting much attention (see Nikkei Mechanical 1990. Nov. 26, pp. 72–79 and Kikai Sekkei Vol. 3, No. 6 (May, 1991), pp. 26–28). The LIGA method can be applied to manufacturing micro machines, optical elements, sensors, actuators and the like, and the applicable field thereof is very wide.

In the conventional LIGA method, polymethylmethacrylate (PPMA) is mainly used as a resist in the step of forming a resist pattern by using X-ray lithography.

FIGS. 1 to 8 are cross-sections schematically showing basic steps of the conventional LIGA method. First, in the step shown in FIG. 1, typically, a resist layer 102 of polymethylmethacrylate (PMMA) is formed to a desired thickness (about several 10 μm to several 100 μm) on a substrate 101. Then, an X-ray mask 100 having a desired pattern 100a is used to expose resist layer 102 with synchrotron orbital radiation (SOR). Then, in the step shown in FIG. 2, resist layer 102 which has been exposed in the step of FIG. 1 is developed to form a resist pattern 103. In the step shown in FIG. 3, substrate 101 having resist pattern 103 formed thereon is dipped in a plating liquid, and Ni, Cu, Au or the like is deposited on depressed portions of resist pattern 103 on substrate 101 by electroplating, thus forming a metal structure 104. In the step shown in FIG. 4, the substrate 101 and the resist are removed to obtain metal structure 104. Metal structure 104 is used as a mold, and dielectric plastic is filled into the metal structure 104 by injection molding, and thus an opposite mold 105 of dielectric plastic is formed. Then, in the step shown in FIG. 5, in accordance with the mold 105 of dielectric plastic fabricated in the step of FIG. 4, a plastic mold 108 of dielectric plastic 106 and a conductive plastic sheet 107 is formed. Then, in the step shown in FIG. 6, mold 105 is removed to separate or release the plastic mold 108. Then, in the step shown in FIG. 7, a metal 109 is deposited on the depressed portion of plastic mold 108 by electroforming. In the step shown in FIG. 8, the plastic 108 is removed, and thus a miniaturized metal structure 110 is obtained. The term "microstructure" used in this specification includes, but is not limited to, metal structure 104 formed in the step of FIG. 3, mold 105 formed in the step of FIG. 4, plastic mold 108 formed in the step of FIG. 5, and metal structure 110 formed in the step of FIG. 8.

The degree of integration of semiconductor integrated circuits has been greatly increased these days, and as the degree of integration becomes higher in VLSIs (Very Large Scale Integrated Circuits), it becomes necessary in the field of manufacturing semiconductor integrated circuits and the like to miniaturize the element structures of the semiconductor devices. To meet this demand, an X-ray (having a wavelength of about 10 Å) lithography method using light having a shorter wavelength than the conventional photolithography employing ultraviolet rays (having a wavelength in the range of about 3000 Å to about 5000 Å) has attracted attention.

FIG. 9 is a cross-section schematically showing an X-ray mask used in the known X-ray lithography method in patterning such a conventional semiconductor integrated circuit. Referring to FIG. 9, the X-ray mask 200 includes a silicon substrate 201 having an opening 201h at a central portion thereof, an X-ray transmitting membrane 202 provided to cover one surface 201a of silicon substrate 201, and an X-ray absorber film 203 having a desired pattern formed on the surface of X-ray transmitting membrane 202. X-ray transmitting membrane 202 is formed of a material which transmits X-rays, that is, a material having a high transmittance of X-rays, such as silicon nitride (SiN) or silicon carbide (SiC).

Meanwhile, X-ray absorber film 203 is formed of a material which absorbs most X-rays, that is, a material having a low X-ray transmittance such as tungsten (W) or tantalum (Ta). X-ray absorber film 203 is supported by X-ray transmitting membrane 202. On the other surface 201b of silicon substrate 201, a film 204 of silicon nitride (SiN), silicon carbide (SiC) or the like is formed. The average thickness of X-ray absorber film 203 in the conventional X-ray mask is about 0.7 μm.

The method of manufacturing a conventional photomask will be described in the following. FIGS. 10 to 17 are cross-sections schematically showing the steps of manufacturing a conventional X-ray mask. First, in the step shown in FIG. 10, X-ray transmitting membrane 202 of silicon nitride (SiN), silicon carbide (SiC) or the like having a thickness of about 2 μm is formed on one surface 201a of silicon substrate 201 by chemical vapor deposition (CVD) or physical vapor deposition (PVD). In this step, a film 204 of silicon nitride (SiN), silicon carbide (SiC) or the like to serve as an etching mask for etching back silicon substrate 201 in the subsequent step (described below) is formed on a prescribed region on the other surface 201b of silicon substrate 201 by chemical vapor deposition or physical vapor deposition. In the step shown in FIG. 11, an X-ray absorber film 203a of tungsten (W), tantalum (Ta) or the like is formed by chemical vapor deposition or physical vapor deposition on the surface of X-ray transmitting membrane 202. The thickness of X-ray absorber film 203a is about 0.7 μm. In the step shown in FIG. 12, a resist layer 205 is formed by spin coating a resist material on the surface of X-ray absorber film 203a.

A method of applying a resist on the surface of X-ray absorber film 203a by spin coating will be described by way of example. First, a prescribed amount of the resist material is dropped from a nozzle onto the surface of X-ray absorber film 203a and left as it is for a while, so that the resist spreads on the surface of X-ray absorber film 203a. Then, by rotating silicon substrate 201 at a high speed by using a spinner or the like, excessive resist material is scattered and spread, thereby forming a resist layer 205 having uniform thickness. The thickness of resist layer 205 formed on the surface of X-ray absorber film 203a is normally 3 μm or less, though it depends on the viscosity of the applied resist material, the speed and number of rotations of the spinner, and the type and speed of gasification of the gasifier of the solvent.

Then, in the step shown in FIG. 13, a pattern is drawn on resist layer 205 (i.e., the resist layer is exposed) to provide a desired mask absorber by using electron beam 206 emitted from an electron gun (an electron beam emitting apparatus, which is not shown). In the step of FIG. 13, when a resist for photolithography is used, resist layer 205 may be exposed with an ultraviolet ray (having a wavelength in the range of about 3000 Å to about 5000 Å) to provide a desired mask absorber.

In the step shown in FIG. 14, by developing the exposed resist layer 205 and removing portions 205b, a desired resist pattern 205a is formed. In the step shown in FIG. 15, using resist pattern 205a as a mask, areas of X-ray absorber film 203a that are exposed through opening portions 205b are etched so that X-ray absorber film 203a is penetrated, by dry etching such as reactive ion etching (RIE). Then in the step shown in FIG. 16, the resist layer 205a is removed, the film 204 is used as an etching mask, and silicon substrate 201 is removed by etching (back etching) from the other surface 201b of the substrate 201 up to X-ray transmitting membrane 202 by dry etching such as reactive ion etching, wet etching or the like, and thus an X-ray mask 200 is formed (see FIG. 17).

Again referring to FIG. 13, by using electron beam 206 or an ultraviolet ray, resist layer 205 can be exposed with sufficiently high precision in a desired shape to the depth of at most 2 μm in the thickness or depth direction of resist layer 205. The reasons for this are that the electron beam or the ultraviolet ray is absorbed by the resist and the precision of the resist pattern is decreased by diffraction of light, and so on.

Referring again to FIG. 15, in the step of etching X-ray absorber film 203a by using resist pattern 205a as a mask, in order to etch X-ray absorber film 203a deeply in the thickness or depth direction of the membrane 203a, it is necessary to increase the selection ratio represented by the following equation (1):

$$\text{selection ratio} = \frac{\text{etch rate of X-ray absorbing membrane}}{\text{etch rate of resist}}.$$

However, though various etching reaction gases are used, there is a limit to increasing the selection ratio.

As mentioned above, the thickness of the X-ray absorber film of the conventional X-ray mask is about 0.7 μm. The reason why this is so will now be described. First, in the conventional, method of manufacturing an X-ray mask shown in FIGS. 10 to 17, it was difficult to make the X-ray absorber film thicker than 0.7 μm. More specifically, in the conventional method of manufacturing the X-ray mask, the resist layer is formed by spin coating, and therefore it is difficult to make the resist layer thick. In addition, it was difficult to form a deep resist pattern with a high precision in the depth direction of the resist layer due to diffraction of light, insufficient intensity of the exposure light source and so on, because the resist layer is exposed by an electron beam or an ultra violet ray. In addition, there is a limit to increasing the selection ratio of the etch rate of the resist layer relative to the etch rate of the X-ray absorber film, as described above.

As a second reason, in the field of manufacturing semiconductor devices, light having a wavelength in the range of about 10 Å to about 4000 Å is generally used in the step of exposure during lithography. Therefore, when the X-ray absorber film is thick, the resolution of patterns to be transferred onto the resist layer is decreased by the diffraction effect of the light.

In accordance with the conventional method of manufacturing the X-ray mask shown in FIGS. 10 to 17, even if the selection ratio is increased, the thickness of the X-ray absorber film which can be patterned is at most 3 μm.

In lithography used in the process of manufacturing semiconductors, it is known to use a copolymer resist including methylmethacrylate (MMA) and methacrylic acid (MAA) (see J. Electrochem., Soc., Vol. 1126, No. 1 (1979), pp. 154~161).

In the step of forming a resist layer on the semiconductor substrate during lithography used in the process of manufacturing semiconductors, normally spin coating is employed.

A method of applying a copolymer resist including methylmethacrylate and methacrylic acid units on a semiconductor substrate will now be described by way of example.

In lithography employed in the process of manufacturing semiconductors, the copolymer resist including methylmethacrylate and methacrylic acid units is produced by polymerizing methylmethacrylate monomer and methacrylic acid monomer in a solvent such as toluene. The copolymer including methylmethacrylate and methacrylic acid units produced in the solvent is then precipitated by methanol or the like. The copolymer is next purified, and then dissolved in a solvent such as ethyl cellosolve acetate (ECA). The solution including the copolymer is dropped onto a semiconductor substrate and applied to have a prescribed uniform thickness on the substrate by spin coating. Then, the substrate on which the solution has been applied is subjected to thermal processing to remove the solvent. Thus, a copolymer resist layer including methylmethacrylate and methacrylic acid units is formed on the semiconductor substrate. The thickness of the resist layer formed in this manner on the semiconductor substrate is 3 μm or less.

Now, in the field of forming microstructures using the LIGA method and the like described above, it is inevitable that long periods of exposure using a large-scale high-performance synchrotron orbital radiation apparatus having high light intensity would be used, because the PMMA resist does not absorb X-rays very much. In order to obtain a resist pattern having a high resolution, the diffraction effect of the light must be decreased, and in order to realize a deeper exposure in the vertical direction of about several 10 μm or more, synchrotron orbital radiation of short wavelength about 2 Å to about 5 Å is necessary.

FIG. 18 is a graph showing a relation between the thickness or depth of the resist that can be patterned for a resist layer including generally employed polymethylmethacrylate (PMMA) and the wavelength of the X-ray. Referring to FIG. 18, theoretically, it is possible to pattern deeply with high precision in the thickness or depth direction of the resist layer by thickly forming the resist layer, using light of short wavelength and reducing the diffraction effect of light.

Therefore, especially in the field of the LIGA method, in order to form microstructures having a high aspect ratio, a synchrotron orbital radiation apparatus which can emit synchrotron orbital radiation of short wavelength of about 2 Å to about 5 Å with a high light source intensity for a long period of time has been desired. However, use of such synchrotron orbital radiation apparatus is generally difficult.

Microstructures such as micro machines, optical elements, sensors, actuators and the like must have sufficient mechanical strength, and for this reason, it is necessary to form structures having portions that are finely processed on the order of μm dimensions and having a high aspect ratio. Such microstructures have various thicknesses dependent on the applications and purposes of such structures, and normally the thickness varies in the range of about 1 µm to 1 mm. When a microstructure such as a micro machine is to be formed by the LIGA method, it is necessary to make the resist layer 102 thick, e.g. several 10 µm to several 1,000 µm, to form deep resist patterns in the thickness or depth direction of the resist layer, as compared with the manufacturing of the semiconductor integrated circuits, as can be seen from FIG. 1. Therefore, when microstructures are to be formed by the LIGA method or the like, it is necessary to carry out long duration exposures with synchrotron orbital radiation having a short wavelength of about 2 Å to 15 Å by using the X-ray mask 100, to reduce the diffraction effect of the light and to expose the resist layer deeply in the thickness or depth direction.

FIG. 19 is a graph showing a relation between the film thickness of the necessary X-ray absorber used for the X-ray mask in manufacturing micro machines and the like by the LIGA method and the wavelength of the X-ray. Referring to FIG. 19, when micro machines and the like are to be manufactured by the LIGA method, the average thickness of the X-ray absorber of the X-ray mask must be at least 5 µm. More specifically, the conventional X-ray mask used in manufacturing semiconductor integrated circuits has an X-ray absorber with average thickness of about 0.7 µm so that when the resist layer 102 is irradiated with synchrotron orbital radiation for a long period of time using the X-ray mask 100, the synchrotron orbital radiation passes through the X-ray absorber film 100a, causing exposure of portions of the resist layer 102 that are not intended to be exposed. Therefore, the desired resist pattern cannot be obtained.

For manufacturing micro machines and the like by the LIGA method, an X-ray mask having an X-ray absorption membrane which can sufficiently intercept the synchrotron orbital radiation even when it is exposed to the synchrotron orbital radiation for a long time, that is, an X-ray mask having an X-ray absorber film with average film thickness of at least 5 µm has long been in demand. Meanwhile, the average film thickness of the X-ray absorber film formed by the conventional method of manufacturing the X-ray mask is about 0.7 µm and it is difficult to manufacture an X-ray mask having an X-ray absorber film with an average thickness of 3 µm or thicker by the conventional method.

SUMMARY OF THE INVENTION

An object of the present invention is to provide a method of forming highly precise microstructures having a high aspect ratio.

Another object of the present invention is to provide a method employing the above described LIGA method for forming highly precise microstructures having a high aspect ratio by selecting an appropriate resist.

Still another object of the present invention is to provide a method of forming microstructures including, at the time of effecting lithography, the step of selecting an appropriate resist and a novel step of forming the resist to be relatively thick on the substrate, whereby highly precise microstructures having a high aspect ratio can be formed.

A still further object of the present invention is to provide an X-ray mask suitable for use in the step of lithography in a method of forming microstructures.

The resist used in the step of lithography for forming microstructures according to the invention is required to have the following characteristics:

high sensitivity;
high resolution;
ability to be formed thick in the vertical direction with respect to the substrate; and
ability of a thick resist layer to be used with a vertically deep exposure in the depth direction of the resist, enabling formation of a resist pattern having a high aspect ratio.

The inventors have studied the forming of microstructures having a high aspect ratio and have found that a copolymer resist including methylmethacrylate and methacrylic acid units used in lithography for manufacturing semiconductors has a higher sensitivity than PMMA, and that the copolymer including methylmethacrylate and methacrylic acid units is suitable as a resist used in the step of lithography for forming microstructures. The present invention is based on these findings.

More specifically, the method of forming a microstructure in accordance with the present invention includes the steps of forming a resist on a substrate and forming a resist pattern on the resist by lithography using synchrotron orbital radiation. The resist layer is made of a resist including as a major substance a copolymer consisting of a unit generally represented as

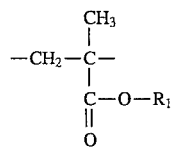

(where $R_1$ represents an alkyl group having one to four carbon atom(s) and the hydrogen atom of the alkyl group may be substituted for by a halogen atom), and a unit generally represented as

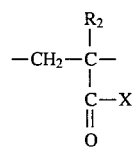

(where X represents a halogen atom or a hydroxyl group, and $R_2$ represents a hydrogen atom or a methyl group).

Preferably, the method of forming a microstructure in accordance with the present invention further includes the step of depositing a metal by electroforming in accordance with the resist pattern.

In the method of the present invention, the resist is preferably a resist layer and the step of forming the resist layer on the substrate includes the steps of pre-polymerizing a monomer generally represented as

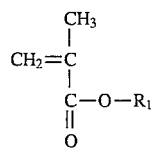

(where $R_1$ represents an alkyl group having one to four carbon atom(s) and the hydrogen atom of the alkyl group may be substituted for by a halogen atom) and a monomer generally represented as

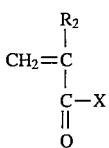

(where X represents a halogen atom or hydroxyl group and $R_2$ represents a hydrogen atom or a methyl group) for preparing a copolymer syrup, then applying the copolymer syrup on the substrate to form a layer, and next fully polymerizing the copolymer syrup layer on the substrate.

Preferably, the step of patterning the resist includes the step of forming a resist pattern by lithography on the resist layer using synchrotron orbital radiation.

Preferably, the method of the present invention includes the steps of forming a resist layer on a substrate surface, forming a resist pattern having an opening by lithography on the resist layer using synchrotron orbital radiation, and removing the portion of the substrate which is exposed through said opening by using said resist pattern as a mask.

The step of forming the resist layer on the substrate surface includes pre-polymerizing a monomer generally represented as

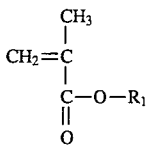

(where $R_1$ represents an alkyl group having one to four carbon atom(s) and the hydrogen atom of the alkyl group may be substituted for by a halogen atom) and a monomer generally represented as

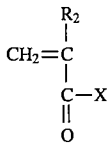

(where X represents a halogen atom or hydroxyl group and $R_2$ represents a hydrogen atom or methyl group) for preparing a copolymer syrup, then applying the copolymer syrup on the surface of the substrate, and then fully polymerizing the copolymer syrup formed on the surface of the substrate.

The X-ray mask in accordance with the present invention includes an X-ray transmitting membrane formed of a material which transmits X-rays, and an X-ray absorber film formed on the surface of the X-ray transmitting membrane. The average film thickness of the X-ray absorber film is at least 5 μm.

The copolymer resist used in the present invention can be represented by way of example by the following formula:

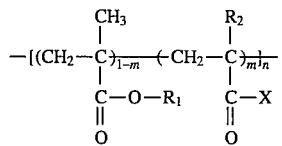

(where $R_1$ represents an alkyl group having one to four carbon atom(s) and the hydrogen atom of the alkyl group may be substituted for by a halogen atom, X represents a halogen atom or a hydroxyl group, and $R_2$ represents a hydrogen atom or a methyl group).

Various resist material monomers used in lithography in the process of manufacturing semiconductors may be used as the methacrylic acid ester monomer used in the present invention. The methacrylic acid ester monomer used in the present invention can be generally represented as:

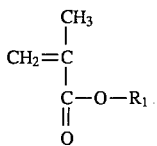

(where $R_1$ represents an alkyl group having one to four carbon atom(s) and the hydrogen atom of the alkyl group may be replaced by a halogen atom).

In the formula, $R_1$ includes n-alkyl group, a primary alkyl group, a secondary alkyl group and a tertiary alkyl group. Specific examples of the methacrylic acid ester used in the present invention include, for example, methylmethacrylate, 2-fluoro ethyl methacrylate, 2,2,2-trifluoro ethyl methacrylate, tetra fluoroisopropyl methacrylate, hexafluorobutyl methacrylate, 2-chloroethyl methacrylate and 2-bromoethyl methacrylate (see Solid State Technology/Japanese version/February 1990, pp.28–35). Various monomers represented by the following formula may be used as the monomer for copolymerization with the above mentioned methacrylic acid ester of the copolymer resist used in the present invention:

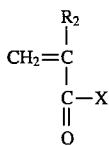

(where X represents a halogen atom or a hydroxyl group, and $R_2$ represents a hydrogen atom or a methyl group). Specific examples of such monomers include, for example, methacrylic acid, methacryloyl halogenoid, acryl acid, acryloyl halogenoid and so on.

The term "pre-polymerizing" herein means mixing monomers and polymerizing the mixed monomers to a prescribed extent, so that part of the mixed monomers and a resulting copolymer exist together. The term "copolymer syrup" used herein means a syrup in which part of the mixed monomers and the resulting or produced copolymer exist together.

At an exposed portion of the resist irradiated by synchrotron orbital radiation, the primary chain of the copolymer resist material is broken or disrupted and the copolymer resist turns to a water soluble substance having a carboxyl group at its chain ends. Thus its solubility is increased in an alkaline developer which was used in the development of a chemical amplification resist and in a developer such as ethyl cellosolve acetate (ECA), methyl cellosolve acetate, cyclopentane and methylisobutylketone, so that it becomes soluble in a developer. In the step of forming a resist pattern by lithography on the resist using synchrotron orbital radiation, the exposure time (T) necessary for lithography is determined by the intensity (I) of the exposure light source and the sensitivity (S) of the resist, as represented by the equation (2):

$$T=S/I.$$

The copolymer resist mentioned above in accordance with the present invention has a high responsiveness, and therefore the value of sensitivity (S) in the above equation (2) can be made small. Since the value of sensitivity (S) in the equation (2) is decreased, the exposure time can be shortened without increasing the intensity of the exposure light source.

When the copolymer resist mentioned above is used, a deeper exposure in the vertical direction is possible even when the intensity of the exposure light source is weak, for example, even if synchrotron orbital radiation having a long wavelength is used, because the sensitivity of the resist is high.

The resolution of the resist can be improved by reducing the diffraction effect of light, that is, by employing light having a short wavelength. By using the copolymer resist mentioned above in accordance with the present invention, the resolution also can be improved by the chemical reaction mechanism and the development mechanism of the resist.

As described above, using the copolymer resist in accordance with the present invention, a resist pattern having a high aspect ratio can be formed with a smaller amount of irradiation. Therefore, a microstructure having a high aspect ratio can be obtained by carrying out normal electroplating, electroforming and the like in accordance with the obtained resist pattern. By etching a substrate portion that has been exposed through an opening of the resist pattern used as a mask, a microstructure having a high aspect ratio and having a recess in the depth direction of the substrate can be obtained.

When the resist is formed on the surface of the substrate through the above described steps of pre-polymerizing the two above defined monomers to prepare a copolymer syrup including these, applying the copolymer syrup on the surface of the substrate and fully polymerizing the copolymer syrup formed on the surface of the substrate by the step of application on the surface of the substrate, the resulting resist can be made thicker than the resist formed by the conventional spin coating method.

In accordance with the present invention, a resist is formed thick on a surface of a substrate, a resist pattern having an opening is formed, and the substrate portion exposed through the opening is etched away using the resist pattern as a mask. Thereby, the substrate can be etched deeper in the depth direction as compared with the conventional example in which the resist is formed by spin coating on the surface of the substrate, without increasing the selection ratio defined by the equation (1), because the resist film can be formed thicker.

Further, the X-ray mask in accordance with the present invention includes an X-ray absorber film having an average thickness of at least 5 μm. Therefore, when a resist pattern is formed by lithography with synchrotron orbital radiation on the resist, which has been formed on the substrate using the X-ray mask in accordance with the present invention, the X-ray absorber film can sufficiently intercept the synchrotron orbital radiation even if the resist is exposed to the synchrotron orbital radiation of a prescribed intensity for a long period of time through the X-ray mask of the present invention. Accordingly, a resist pattern having a high aspect ratio can be formed with high precision. By using the X-ray mask in accordance with the present invention, a resist pattern having a higher aspect ratio can be formed as compared with lithography using the conventional X-ray mask that is generally used in manufacturing semiconductor integrated circuits. Therefore, by carrying out normal electroplating, electroforming and the like in accordance with the obtained resist pattern, a microstructure having a higher aspect ratio can be obtained.

The foregoing and other objects, features, aspects and advantages of the present invention will become more apparent from the following detailed description of example embodiments of the present invention when taken in conjunction with the accompanying drawings.

DESCRIPTION OF THE PREFERRED EMBODIMENTS

EMBODIMENT 1

(1) Preparation of Copolymer Syrup

Example 1

Figure 1:
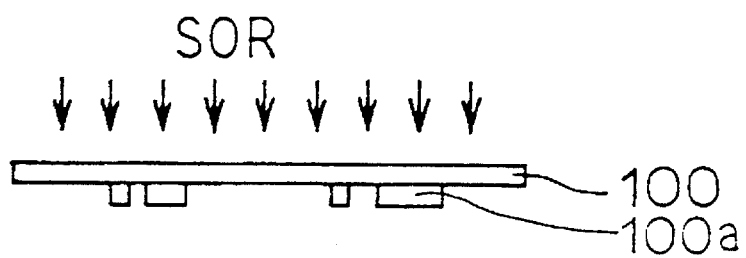
FIGS. 1 to 8 are cross-sections schematically showing the first to eighth basic steps of the conventional LIGA method.
Figure 2:
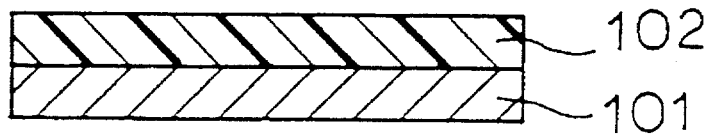
Figure 3:
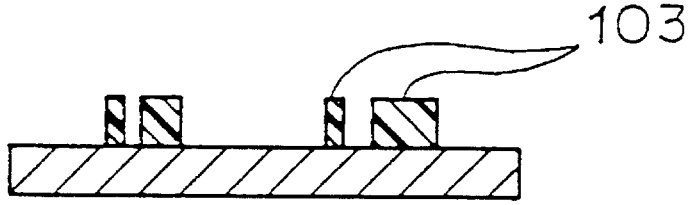
Figure 4:
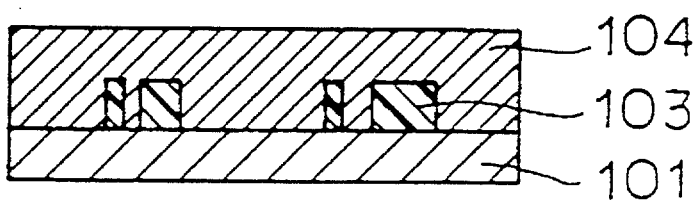
Figure 5:
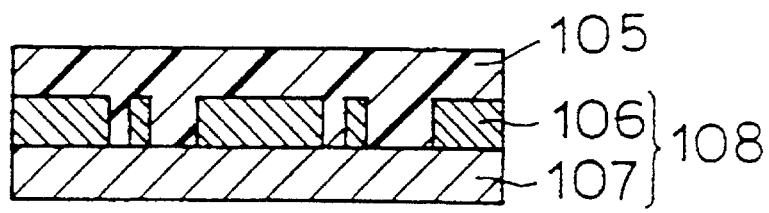
Figure 6:
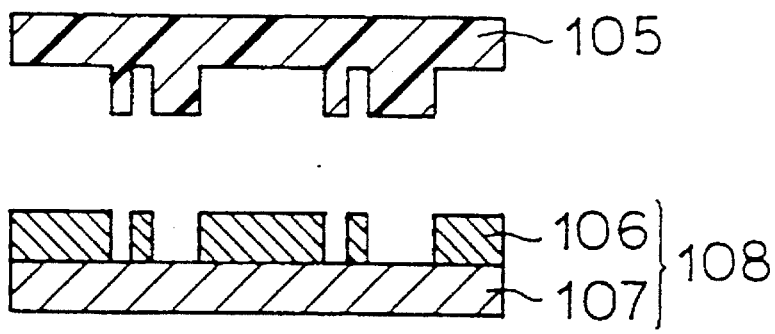
Figure 7:
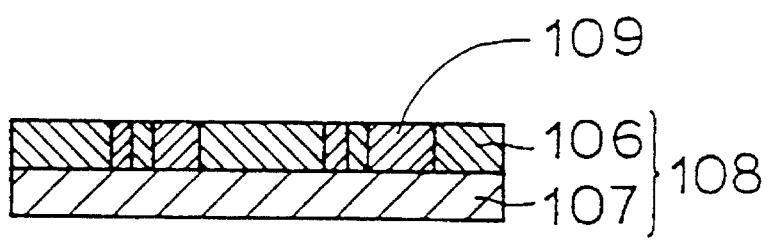
Figure 8:
Figure 9:
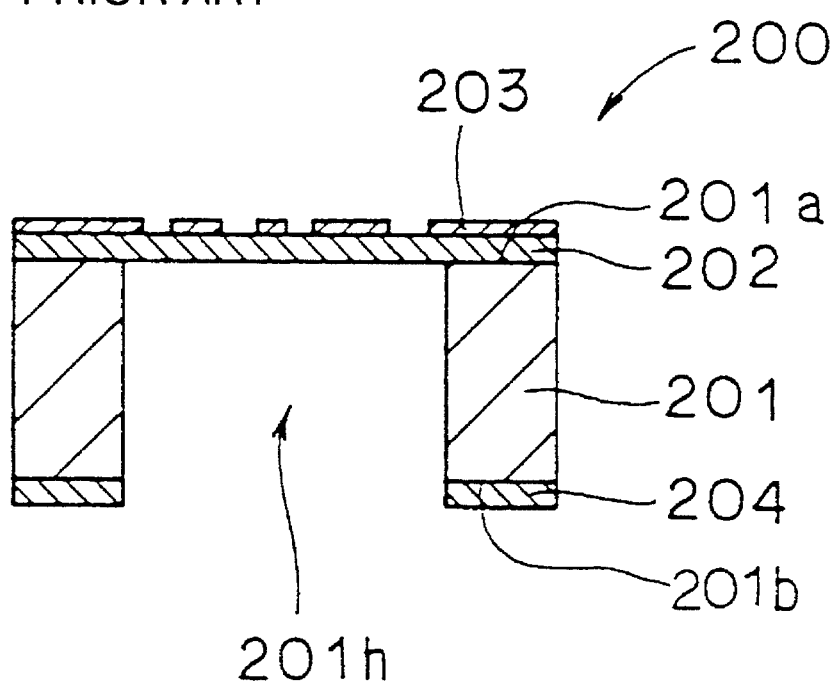
FIG. 9 is a cross-section schematically showing an X-ray mask used in the conventional X-ray lithography.

First, a mixture of 95 g (0.95 mole) of methylmethacrylate monomer (molecular weight (100) and 5 g (0.051 mole) of methacrylic acid (molecular weight 86) was prepared. Then, 0.2 g (about 0.2 wt % with respect to the mixed monomer) of 2,2'-azobis (isobutyronitrile) AIBN) was added to the mixture as a polymerization initiator. Then, pre-polymerization was effected for 50 minutes at 60° C. in an $N_2$ gas atmosphere by bulk polymerization, and a copolymer syrup of methylmethacrylate and methacrylic acid units was produced. The weight average molecular weight of this copolymer syrup including methylmethacrylate and methacrylic acid units was 400,000.

Example 2

Into a mixture of 90 g (0.90 mole) of methylmethacrylate monomer (molecular weight 100) and 10 g (0.116 mole) of methacrylic acid (molecular weight 86), 0.2 g (about 0.2 wt. % with respect to the mixture of monomers) of 2,2'-azobis(isobutyronitrile) (AIBN) was added as a polymerization initiator. Pre-polymerization was effected for 50 minutes at 60° C. in an $N_2$ gas atmosphere by bulk polymerization, and a copolymer syrup including methylmethacrylate and methacrylic acid units was produced. The weight average molecular weight of this copolymer syrup including methylmethacrylate and methacrylic acid units was 500,000.

(2) Formation of the Resist

Figure 20:
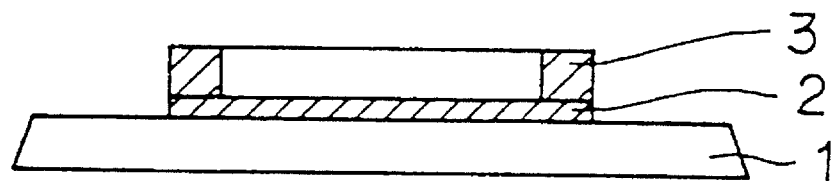
FIGS. 20 to 22 are cross-sections schematically showing the first to third steps for forming a copolymer resist including methylmethacrylate and methacrylic acid units on a substrate.
Figure 21:
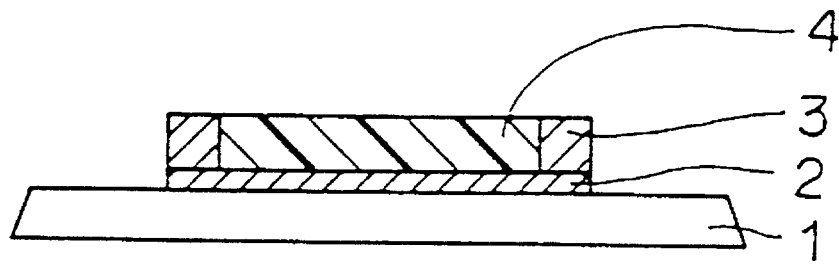
Figure 22:
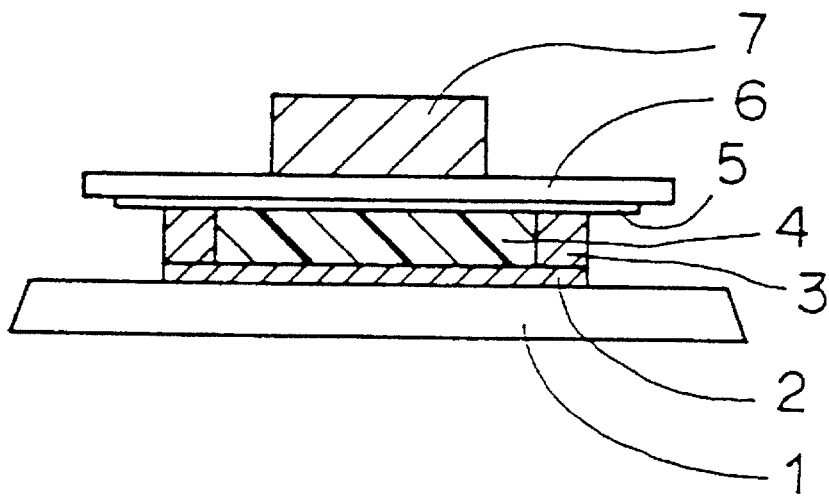

FIGS. 20 to 22 are cross-sections schematically showing the steps of forming a copolymer resist including methylmethacrylate and methacrylic acid units on a substrate in accordance with one embodiment of the present invention.

In the step shown in FIG. 20, a silicon substrate 2 is placed on a hot plate 1, and a spacer 3, made of stainless steel for instance, is placed on the silicon substrate 2. In the step shown in FIG. 21, the copolymer syrup 4 including methylmethacrylate and methacrylic acid units produced in the manner described above is poured or otherwise deposited to fill a space within spacer 3. In the step shown in FIG. 22, a mold releasing sheet 5 made of polyimide such as a "Kapton" sheet 5 ("Kapton" is a registered trademark of DuPont) is placed on spacer 3, a metal plate 6 is placed on Kapton sheet 5, and a weight 7 is placed on metal plate 6. Then, this arrangement is heated to and kept at 70° C. by the hot plate 1 for one hour, so that the copolymer syrup 4 including methylmethacrylate and methacrylic acid units is fully polymerized on silicon substrate 2.

By the above described steps, a copolymer resist including methylmethacrylate and methacrylic acid units could be formed to the thickness in the range of 50 μm to 350 μm on silicon substrate 2. Resist layers have various thicknesses (several 10 μm to 1 mm) can be formed by changing the thickness or height of spacer 3.

Then, silicon substrate 2 having the resist formed thereon is prebaked by heating it from room temperature to 200° C. in one hour, keeping it at 200° C. for three hours and cooling it from 200° C. to room temperature in three hours.

The prebaking is carried out to remove internal stress in the resist formed on silicon substrate 2 and to improve the adhesiveness of the resist and the silicon substrate 2. The temperature is not particularly limited to 200° C., provided that it is not lower than the glass transition point (about 160° C.) of the copolymer including methylmethacrylate and methacrylic acid units. The time required for increasing the temperature, the time for keeping the temperature constant and the time required for lowering the temperature are not limited. However, the substrate must be kept for a sufficiently long time at a high temperature in order to improve the adhesiveness of the silicon substrate 2 and the copolymer resist including methylmethacrylate and methacrylic acid units.

In order to reduce cracks, it is preferable to make the time for cooling longer than the time for increasing the temperature. In this manner, the generation of cracks can be prevented by lowering the stress generated in the copolymer resist due to the difference in thermal expansion coefficients of the silicon substrate 2 and the copolymer including methylmethacrylate and methacrylic acid units.

(3) Evaluation of the resist and the resist pattern

After forming the copolymer resist, synchrotron orbital radiation of the 0th order having a peak wavelength of about 10 μm is directed at the resist through a Be window using a mask with openings of a desired pattern, by a synchrotron orbital radiation apparatus (TERAS of Electrotechnical Laboratory Agency of Industrial Science and Technology). The amount of irradiation was 30 mA·hour to 90 mA·hour in terms of the accumulated beam current. Then, the silicon substrate 2 having the resist exposed in the above manner is dipped for about 2 minutes in a methylisobutylketone (MIBK) non-diluted liquid at room temperature, with the silicon substrate 2 kept still.

Figure 23:
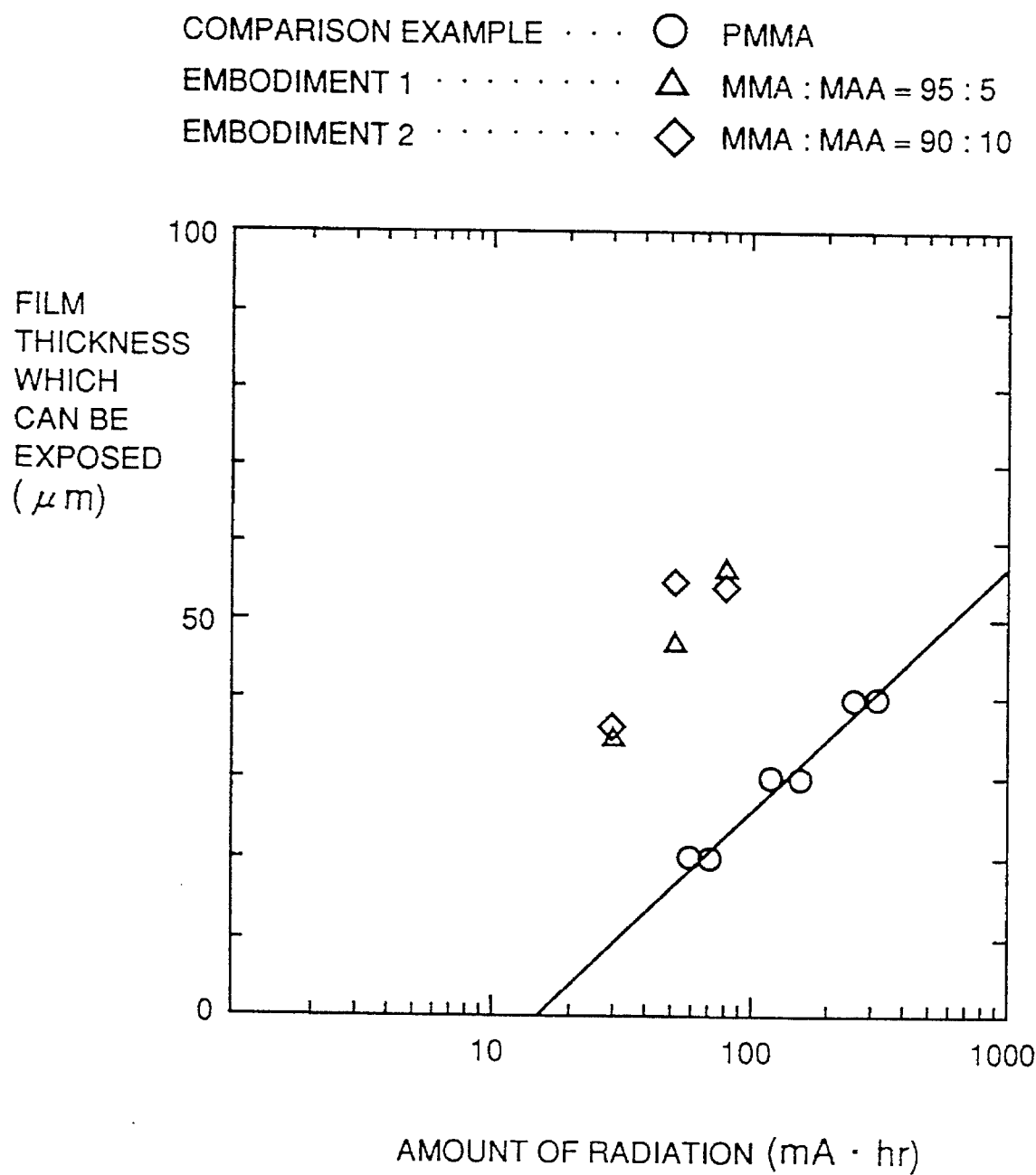
FIG. 23 is a graph showing the thickness (μm) that can be exposed with respect to the amount of radiation (mA·hour) of the synchrotron orbital radiation of polymethylmethacrylate (PMMA) resists and resists formed in accordance with the present invention.

FIG. 23 shows relations between the thickness (μm) that can be exposed and the amount of radiation (mA·hour) of synchrotron orbital radiation, of a conventional resist of polymethylmethacrylate (PMMA) and of the resist formed of a copolymer including methylmethacrylate and methacrylic acid units formed in accordance with the present invention.

As is apparent from FIG. 23, each of the resists formed by fully polymerizing the copolymer of Examples 1 and 2 described above on the substrate 2 can be exposed more deeply with a smaller amount of radiation as compared to the conventional resist of PMMA. More specifically, the resist of the copolymer including methylmethacrylate and methacrylic acid units formed in accordance with the present invention is highly sensitive as compared with the conventional PMMA resist, and when the copolymer resist of the invention is formed thick on the substrate in accordance with the present invention, a deep exposure is possible. Accordingly, the resist pattern formed by development is deep in the vertical direction with less die wear, and with high resolution.

The sensitivities of the resists provided by fully polymerizing the copolymer syrups including Examples 1 and 2 were approximately the same. The amount of synchrotron orbital radiation and the vertical depth of the resist pattern of PMMA as a comparative example and of the resist of copolymers including methylmethacrylate and methacrylic acid units formed in accordance with the present invention were compared. The results of the comparison are shown in Table 1 below.

TABLE 1

| Resist | Amount of Radiation (mA · hr) | Depth (μm) |
| --- | --- | --- |
| Example 1 | 30 | 35 |
| Example 2 | 30 | 35 |
| Example for Comparison | 200 | 35 |

As is apparent from Table 1, when a synchrotron orbital radiation of the same output current is used, the time of exposure necessary to obtain the same depth can be reduced to about ⅐ in accordance with the present invention. In other words, if the resist of the present invention is used, a resist pattern that is deep in the vertical direction can be fabricated efficiently in a short period of time.

As compared with the method using spin coating for applying copolymer resist including methylmethacrylate and methacrylic acid units in the processing of semiconductors, the copolymer resist including methylmethacrylate and methacrylic acid units can be formed as a much thicker layer on the substrate by the present embodiment of the invention.

Though the copolymer resist including methylmethacrylate and methacrylic acid units is formed as a thick layer in the present embodiment, the copolymer resist can be exposed deeply by one exposure without generating a positive/negative inversion. Thus, a resist pattern deep in the vertical direction can be formed. More specifically, at the exposed portion of the positive resist, the principal chain of the polymer is broken or disrupted and polymerization is caused by the generated radicals. Accordingly, in the positive resist, the amount of generated radicals increases because of the aforementioned decomposition reaction, and when the decomposition reaction and polymerization reach an equilibrium or when the polymerization proceeds further than the decomposition reaction, the resist becomes insoluble in the developer even if it is further exposed. However, such positive/negative inversion is suppressed in the present embodiment, which enables a deep exposure at one time.

The copolymer resist including methylmethacrylate and methacrylic acid units formed in accordance with the present invention has a higher transmittance of X-rays than does PMMA, which is considered to be a contribution to the present deeper exposure.

In this embodiment, a resist pattern having a depth in the range from about 10 μm to about 1 mm can be formed with a high sensitivity, high resolution and high aspect ratio. Microstructures of various materials requiring a thickness in the range from about 10 μm to about 100 μm can be formed with a high aspect ratio, with high precision in a short period of time, for example, by depositing metal in accordance with the resist pattern.

In this embodiment, the copolymer resist including methylmethacrylate and methacrylic acid units is formed by bulk polymerization. Therefore, in the present invention, which is different from the conventional method in which the resist is formed by spin coating, the step of removing solvent is not necessary. In the present embodiment, the copolymer resist formed on the substrate does not include any solvent.

In the step of forming a resist on the semiconductor substrate employed in lithography during processing conventional semiconductors using spin coating, the solvent might not be completely removed but might partly remain in the resist formed on the semiconductor substrate. If the solvent is left in the resist, it is possible that the solvent is removed by and mixed into the developer during development, causing deformation of the resist pattern or cracks in the resist. Cracks generated in the resist decrease the mechanical strength of the resist and, in the LIGA method, result in plating on unnecessary or unintended areas, so that the intended microstructure as designed cannot be obtained.

Meanwhile, in the present embodiment, the copolymer including methylmethacrylate and methacrylic acid units is prepared by bulk polymerization, whereby deformation of the resist pattern and cracking of the resist at the time of development can be suppressed. In accordance with the present invention, the resist can be formed thick on the substrate. In addition, the deformation of resist patterns and the cracking of the resist do not occur much during development in the resist formed in accordance with the present invention. Therefore, according to the present invention, a microstructure having a high precision and a high aspect ratio can be formed, for example, by forming metal structures by electroplating or the like on the substrate in accordance with the resist pattern.

EMBODIMENT 2

The steps of manufacturing a photomask including an X-ray transmitting membrane formed of a material transmitting X-rays and an X-ray absorber film having an average thickness of at least 5 μm formed on the surface of the X-ray transmitting membrane will be described in the following with reference to FIGS. 24 to 31.

Figure 10:
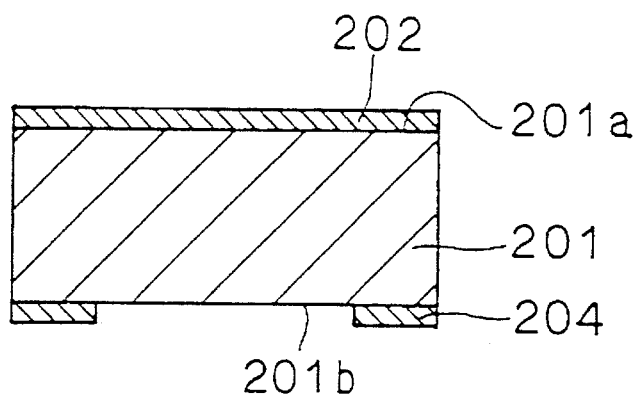
FIGS. 10 to 17 are cross-sections schematically showing the first to eighth steps of forming the X-ray mask used in the conventional X-ray lithography.
Figure 11:
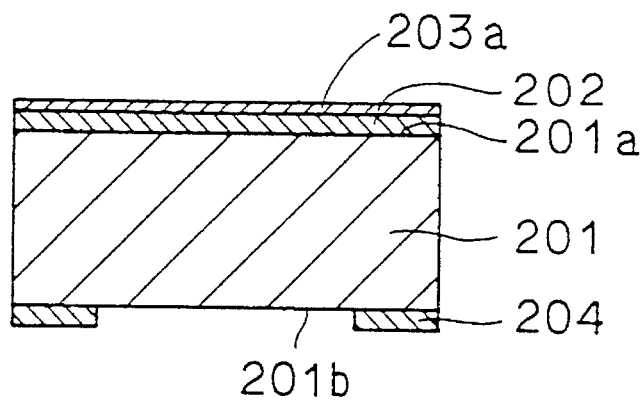
Figure 12:
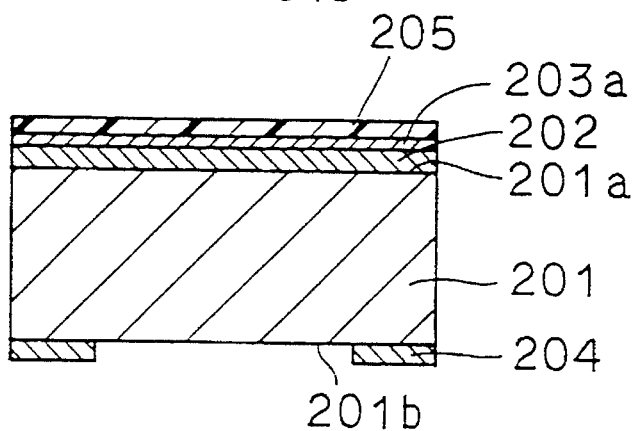
Figure 13:
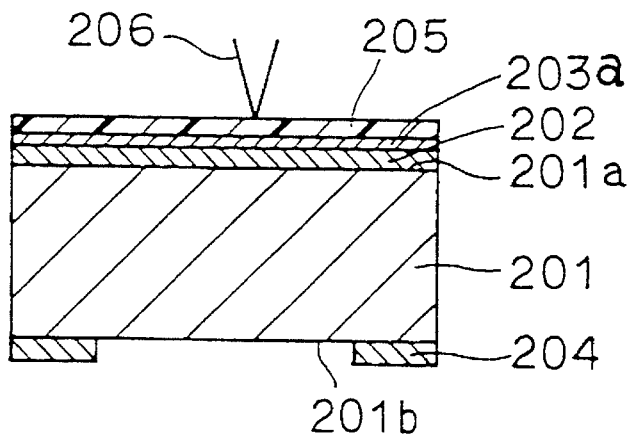
Figure 14:
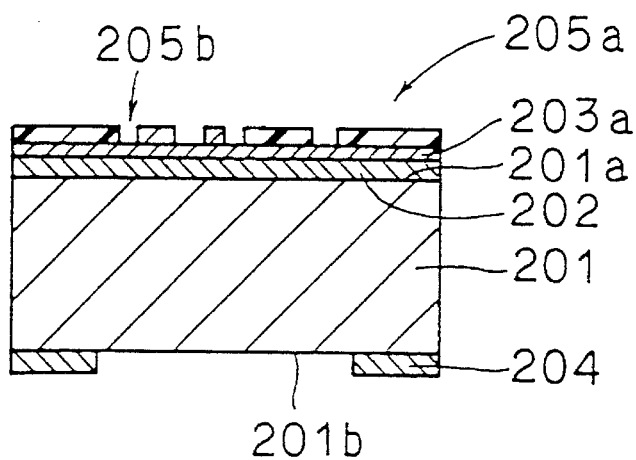
Figure 15:
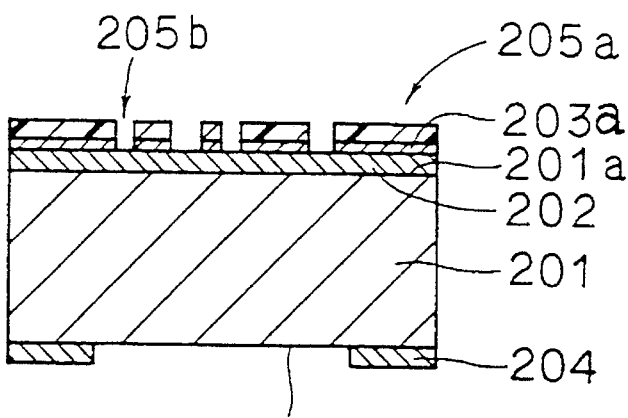
Figure 16:
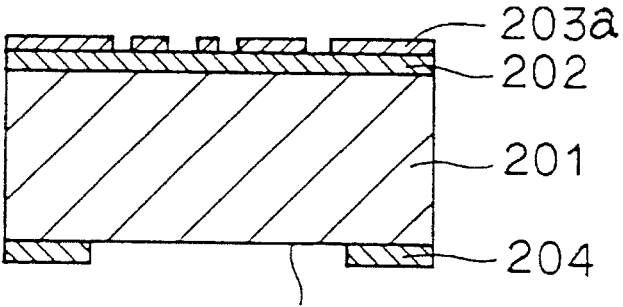
Figure 17:
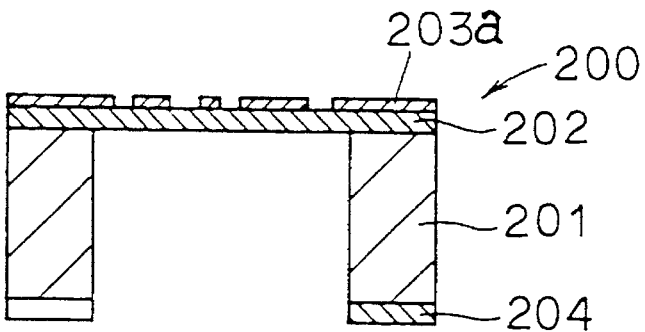
Figure 18:
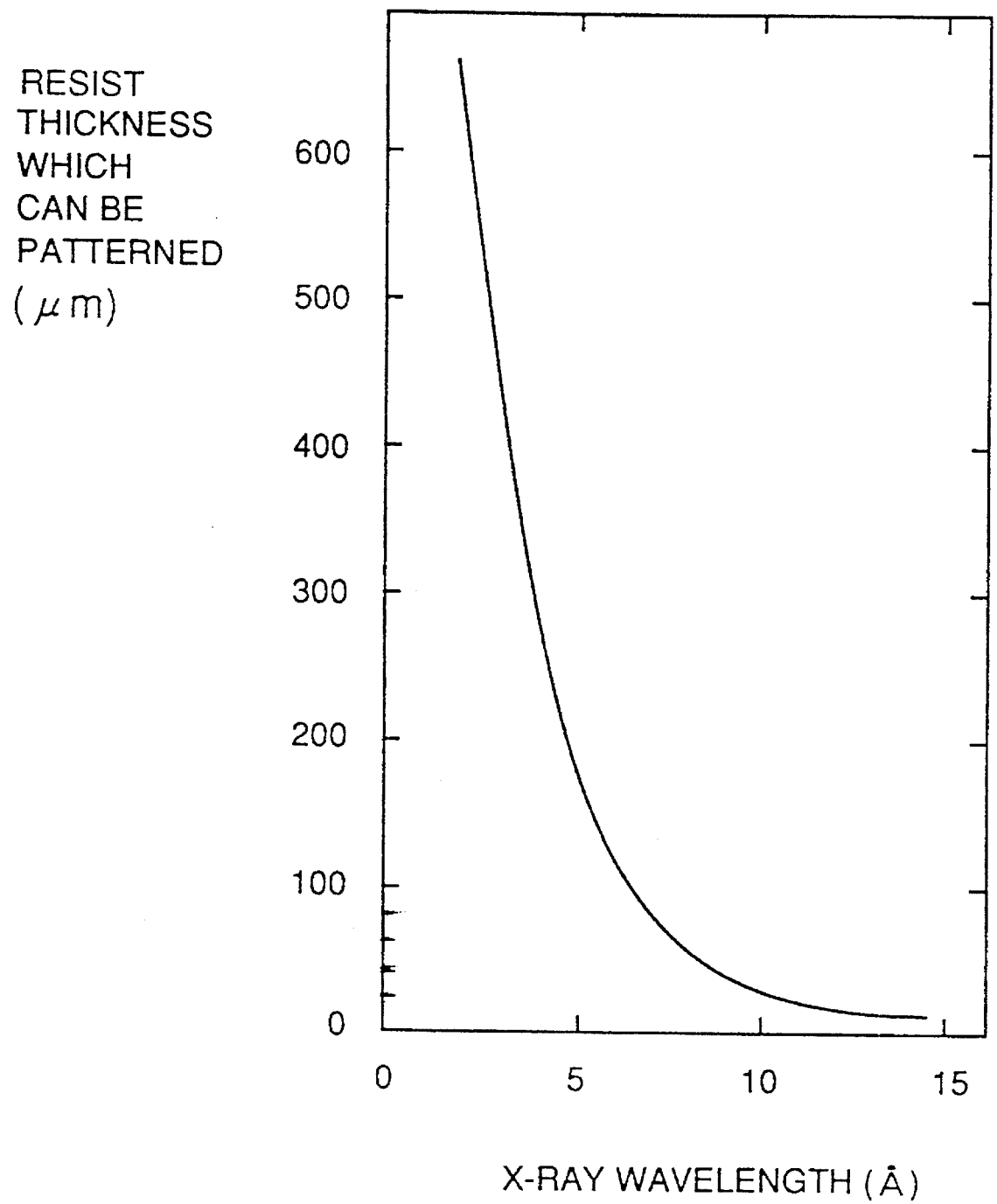
FIG. 18 is a graph showing a relation between the thickness of the resist formed of polymethylmethacrylate (PMMA) that can be patterned and the wavelength of the X-ray.
Figure 19:
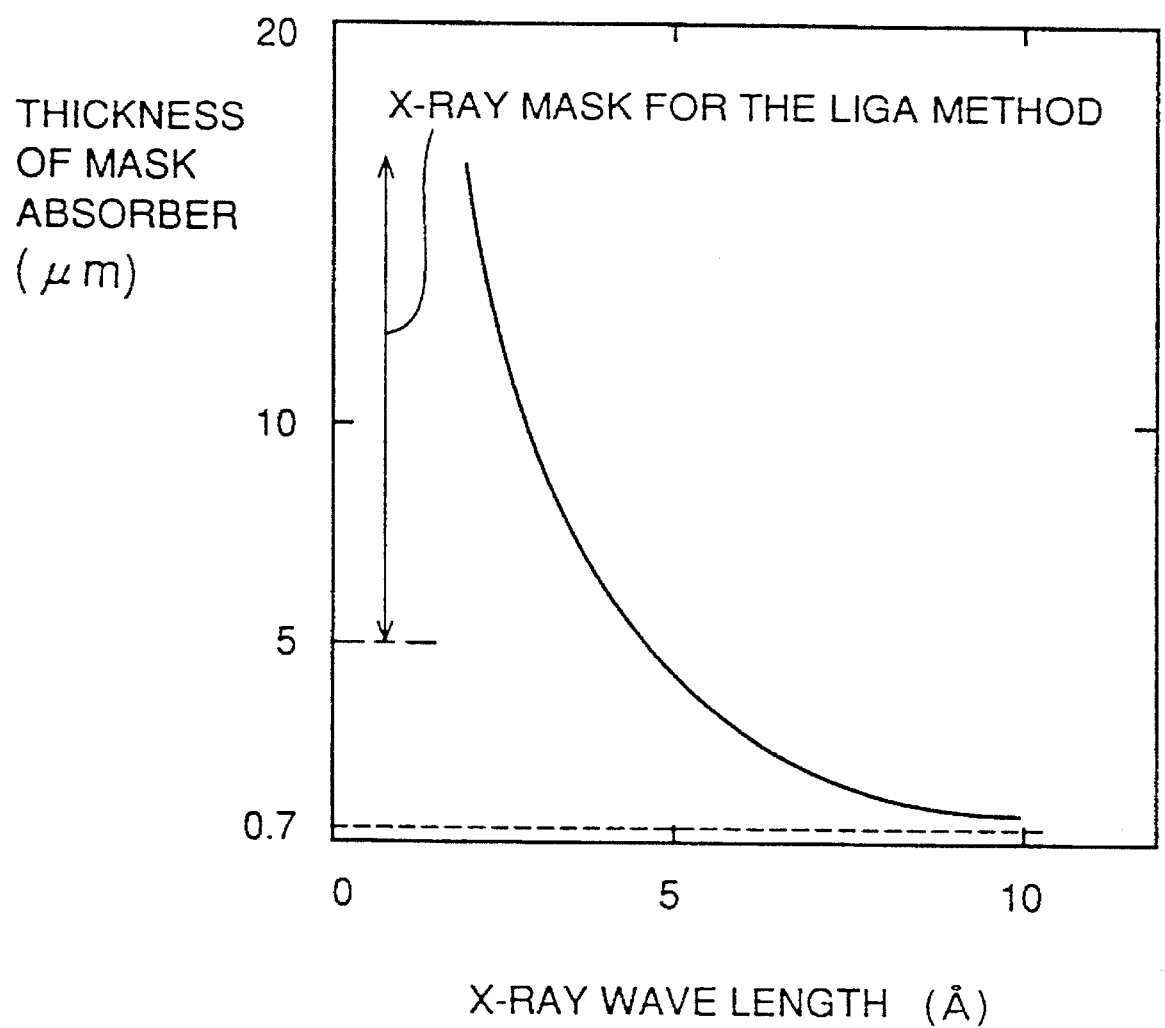
FIG. 19 is a graph showing a relation between the necessary thickness of an X-ray absorber as the X-ray mask used in manufacturing micro machines and the like by the LIGA method, and the wavelength of the X-ray.
Figure 24:
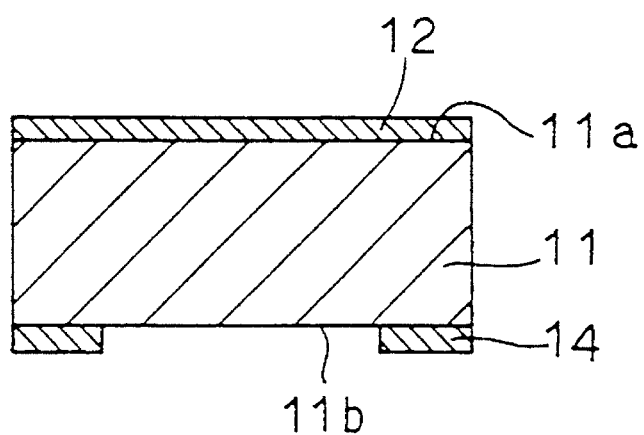
FIGS. 24 to 31 are cross-sections schematically showing the first to eighth steps of manufacturing the X-ray mask in accordance with the present invention.
Figure 25:
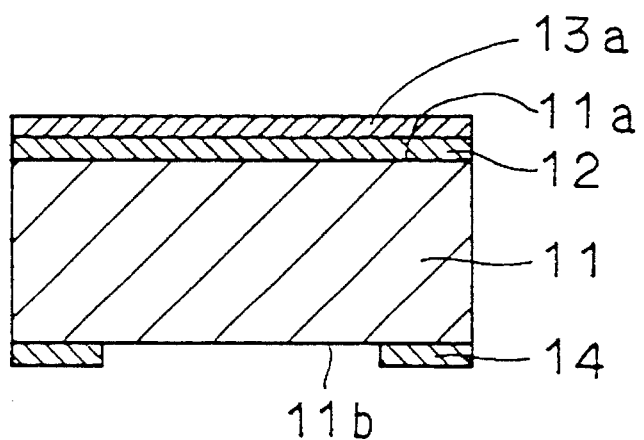

First, in the step shown in FIG. 24, an X-ray transmitting membrane 12 of silicon nitride (SiN), silicon carbide (SiC) or the like having an average thickness of about 2 μm is formed on one surface 11a of a silicon substrate 11 by chemical vapor deposition or physical vapor deposition. Also in this step, a film 14 of silicon nitride (SiN), silicon carbide (SiC) or the like, which will serve as an etch mask for the back etching of the silicon substrate in a subsequent step, is formed on a prescribed region on the other or back surface 11b of the silicon substrate 11, by chemical vapor deposition or physical vapor deposition. The step shown in FIG. 24 is the same as the conventional step shown in FIG. 10. Then, in the step shown in FIG. 25, an X-ray absorber film 13a of tungsten (W), tantalum (Ta) or the like and having an average thickness of 5 μm or any desired thickness of at least 5 μm is formed on the surface of the X-ray transmitting membrane 12 by chemical vapor deposition or physical vapor deposition. The step shown in FIG. 25 is the same as the step shown in FIG. 11 except that the X-ray absorber film 12a is formed thicker than the X-ray absorber film 203a of the conventional X-ray mask.

Figure 26:
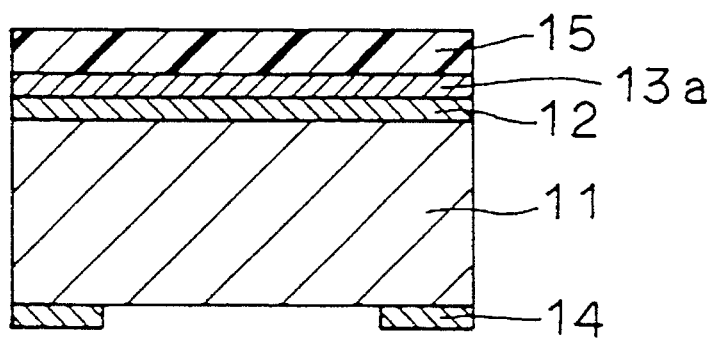

Then, in the step shown in FIG. 26, as in Example 1, a mixture of 95 g (0.95 mole) of methylmethacrylate monomer (molecule weight 100) and 5 g (0.051 mole) of methacrylic acid (molecular weight 86) was prepared, and then 0.2 g (about 0.2 wt. % with respect to the mixture of monomers) of 2,2'-azobis(isobutyronitrile)(AIBN) was added as a polymerization initiator. Next, pre-polymerization was effected for 50 minutes at 60° C. in an $N_2$ gas atmosphere by bulk polymerization, whereby a copolymer syrup of methylmethacrylate and methacrylic acid units was prepared. Then, in comparison to the conventional resist forming step shown in FIG. 1, a copolymer resist 15 including methylmethacrylate and methacrylic acid units was formed on the surface of the X-ray absorber film 13a to an average thickness of 50 μm.

Figure 32:
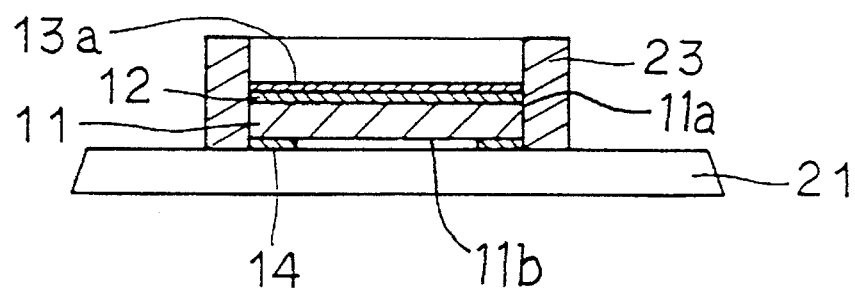
FIGS. 32 to 34 are cross-sections schematically showing the first to third steps of forming a copolymer resist including methylmethacrylate and methacrylic acid units on a substrate in accordance with the present invention, which show details of the step shown in FIG. 26.
Figure 33:
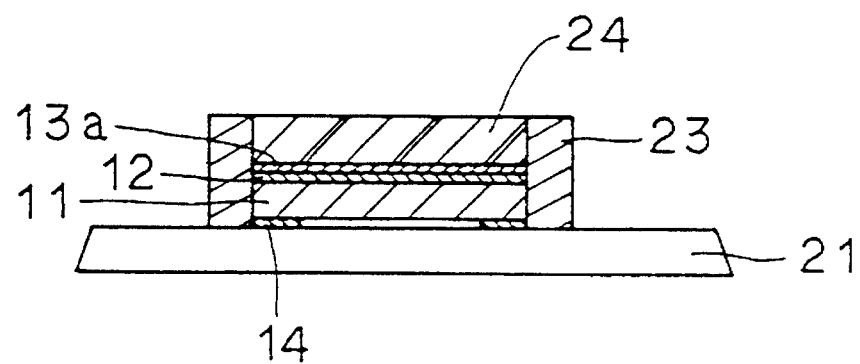
Figure 34:
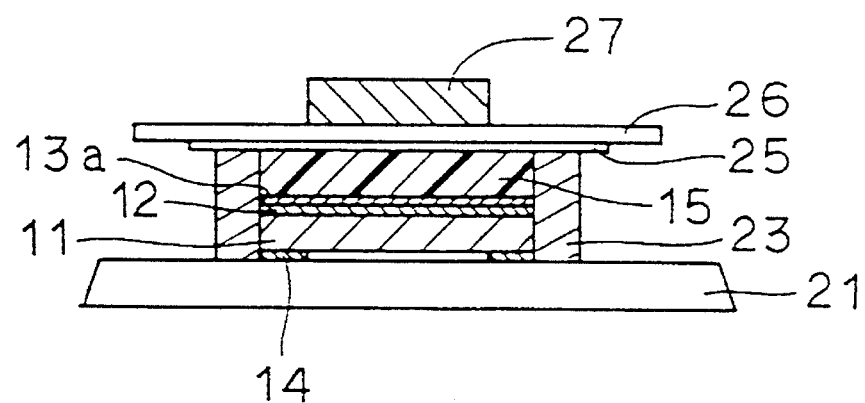

FIGS. 32 to 34 show details of the step shown in FIG. 26. First, in the step shown in FIG. 32, an X-ray transmitting membrane 12 is arranged on one surface 11a of a silicon substrate 11 and an X-ray absorber film 13a is arranged on the surface of the X-ray transmitting membrane 12. A film 14 is arranged at a prescribed region on the other surface 11b of the substrate 11. This stacked arrangement is placed on a hot plate 21, and a spacer 23 is provided to surround the silicon substrate 11. Then, in the step shown in FIG. 33, the copolymer syrup 24 including methylmethacrylate and methacrylic acid units prepared in the above described manner is poured or dropped into the space above the X-ray absorber film 13a to fill the spacer 23. Then, in the step shown in FIG. 34, a Kapton mold releasing sheet 25 is placed on spacer 23, a metal plate 26 is placed on Kapton sheet 25, a weight 27 is placed on metal plate 26, and the substrate is kept at 70° C. for one hour by hot plate 21 so as to fully polymerize the copolymer syrup 24 including methylmethacrylate and methacrylic acid units on X-ray absorber film 13a. Thus, a copolymer resist 15 including methylmethacrylate and methacrylic acid units is provided as shown in FIG. 26.

Figure 27:
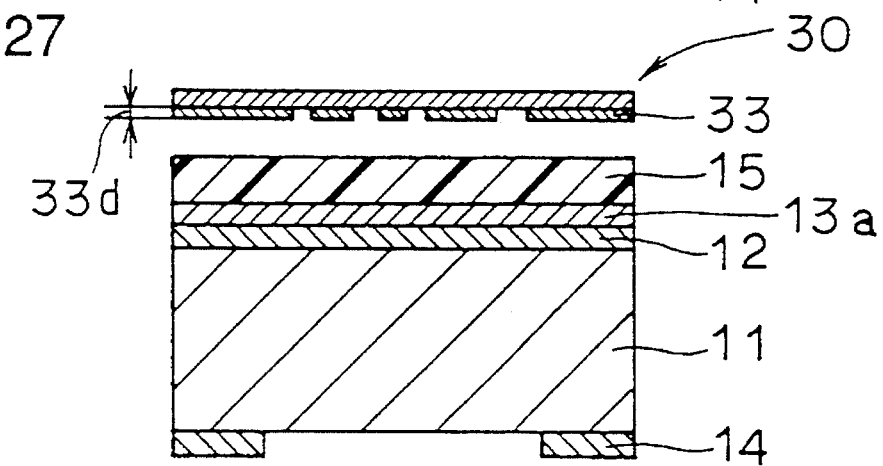

Then, in the step shown in FIG. 27, an X-ray mask 30 having a desired pattern manufactured in accordance with the conventional method and having an X-ray absorber film 33 with an average thickness 33d of 0.7 μm is employed. Such a mask 30 was used in the prior art for masking an electron beam or ultraviolet ray. In the present invention, the mask 30 is used with a synchrotron orbital radiation apparatus (TERAS) of Electrotechnical Laboratory, Agency of Industrial Science and Technology, whereby synchrotron orbital radiation of the 0th order having a peak wavelength of about 10 Å is emitted through a Be window. The amount of radiation is 70 mA·hr to 90 mA·hr in terms of the accumulated beam current value.

Figure 28:
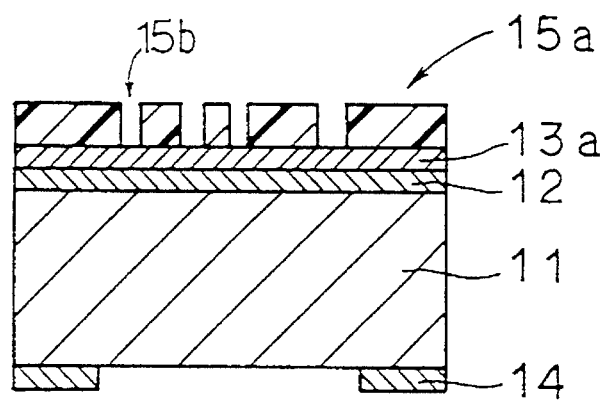

In the step shown in FIG. 28, the silicon substrate 11 having on its surface the resist layer 15 that has been exposed in the above manner, is dipped in a stock solution of methylisobutylketone (MIBK) for about 2 minutes at room temperature, with the silicon substrate 11 kept stationary, for development. In this step, a reduction of the thickness of the resist layer was not observed.

The copolymer resist 15 including methylmethacrylate and methacrylic acid units has a high sensitivity to the synchrotron orbital radiation. Therefore, the copolymer resist 15 can be exposed deeply by a short period of synchrotron orbital radiation. Since the copolymer resist is exposed with a small total amount of synchrotron orbital radiation, the radiation can be sufficiently intercepted by the X-ray mask 30 with the X-ray absorber film 33 having an average thickness $33d$ of 0.7 μm. Undesired or unintended portions of the resist are not exposed, and therefore, a highly precise resist pattern 15a can be obtained with high productivity.

Figure 29:
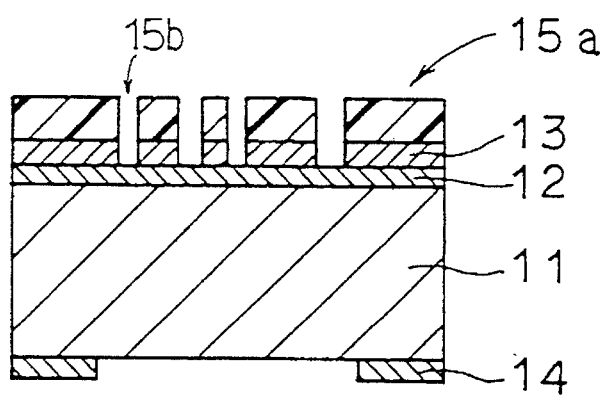

In the step shown in FIG. 29, portions of the X-ray absorber film 13a exposed through an opening 15b of the resist pattern 15a are etched by the RIE method, using the resist pattern 15a formed in the step of FIG. 28 as a mask, so that X-ray absorber film 13a is penetrated at those exposed portions. For etching the absorber film 13a having an average thickness of 5 μm, a known RIE dry etching apparatus is used under the following conditions shown in Table 2.

TABLE 2

| Conditions for etching | |
|---|---|
| Etching Gas (SCCM) | $SF_6$: 25 (SCCM)<br>$CHF_3$: 25 (SCCM) |
| Gas Pressure (Pa) | 15 (Pa) |
| Distance between Electrodes (mm) | 80 (mm) |
| RF power | 500 (W) |
| Etch Time (min.) | 70 (min.) |

In this manner, a finished X-ray absorber film 13 having a desired pattern of high precision and having an average film thickness of 5 μm could be provided.

Figure 30:
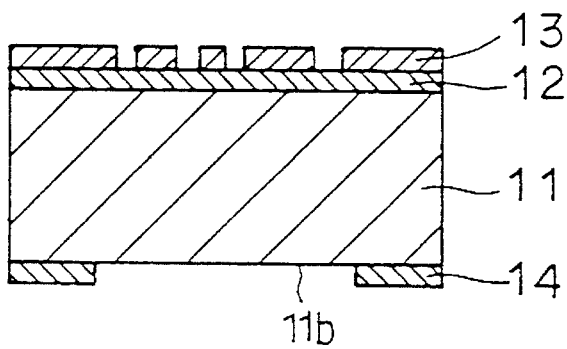
Figure 31:
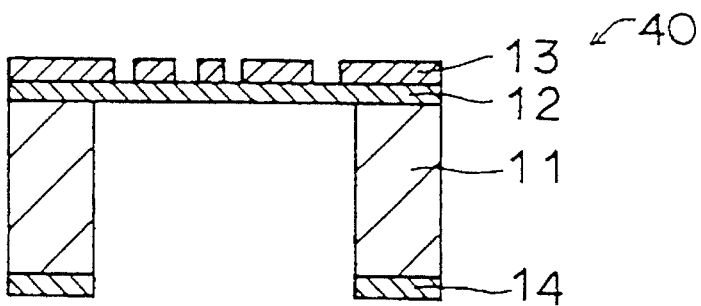

In the step shown in FIG. 30, after the resist layer 15a is removed, the silicon substrate 11 is etched away or back etched from the other or back surface 11b of the substrate 1 by using KOH solution, with the film 14 used as an etching mask. Thus, the X-ray mask 40 of the present invention is obtained as shown in FIG. 31.

According to Embodiment 2 of the invention, which does not use photolithography employing the conventional electron beam or ultraviolet ray having a wavelength of about 3000 Å to 5000 Å, but rather uses X-ray lithography employing synchrotron orbital radiation and conventional etching, an X-ray mask having an X-ray absorber film with an average thickness of at least 5 Åm could easily be formed.

In Embodiment 2, a copolymer resist layer 15 including methylmethacrylate and methacrylic acid units was formed to an average thickness of 50 μm on the surface of the X-ray absorber film 13a. However, the X-ray mask including an X-ray absorber film 13 with an average thickness of at least 5 μm, which could not be formed by the conventional method of manufacturing the X-ray mask, can be obtained according to the invention provided that the average thickness of the copolymer resist 15 is at least 20 μm, by forming a resist pattern 15a having an opening 15b by using X-rays of synchrotron orbital radiation having a peak wavelength of about 10 Å and by etching the X-ray absorber film 13a by using the resist pattern 15a as a mask.

Referring to FIG. 28, the resist pattern 15a formed on X-ray absorber film 13a has edges of the open portions being approximately perpendicular to the surface of X-ray absorber film 13a, and it has superior dimensional precision. Therefore, by etching the X-ray absorber film 13a using the resist pattern 15a as a mass, the X-ray absorber 13 having accurate dimensions can be formed.

The disclosure in embodiment 2 is only an example of the present invention and the scope of coverage is not limited thereto.

According to the present invention, the resist can be formed thick, and a resist pattern having an opening deep in the thickness or depth direction of the resist can be formed. Therefore, by using the resist pattern as a mask for etching the substrate portion exposed through the resist opening, a microstructure having a high aspect ratio with a deep recess in the substrate can be formed.

Although lithography employing a copolymer resist including methylmethacrylate and methacrylic acid units has been described in the above Embodiments 1 and 2, it is simply for the sake of description and the present invention is not limited to a method of forming a microstructure including a step of lithography employing a copolymer resist including methylmethacrylate and the methacrylic acid units.

For example, the copolymer resist to be used according to the invention can alternatively include methacrylic acid ester and methacrylic acid units, methacrylic acid ester and methacryloyl-halogenoid units, methacrylic acid ester and acrylic acid units, or other methacrylic acid ester and acryloyl halogenoid units to achieve the same effect. Any copolymer resist may be used provided that the copolymer resist has a similar chemical reaction mechanism as the above described copolymer resist including methylmethacrylate and methacrylic acid units.

As described above, according to the present invention, a microstructure having a high aspect ratio can be obtained especially by the LIGA method.

In the conventional LIGA method, for example, a microstructure having a high aspect ratio could be obtained only by using a large synchrotron orbital radiation apparatus having high performance when PMMA was used as a resist. According to the present invention, such a microstructure can be formed by a small general purpose synchrotron orbital radiation apparatus, by using the resist of the present invention which has improved sensitivity.

Since the resist sensitivity of the present invention is higher than that of PMMA, the resist can be exposed in a shorter period of time, and therefore the time necessary for forming a microstructure can be reduced.

The resolution of the resist can be improved by reducing the diffraction effect of light, that is, by using light having shorter wavelength. By the present invention, it can also be improved by the chemical reaction mechanism and the development mechanism of the resist.

In addition, in accordance with the present invention, since the resist can be formed thick and a resist pattern having a high aspect ratio can be formed, a microstructure having a high aspect ratio can be formed in the field of forming three-dimensional structures by microprocessing, especially in the field of LIGA.

More particularly according to the invention, the resist can be formed thick on the surface of the substrate, and the resist pattern having an opening with a high aspect ratio can be formed. As a result, by etching away the substrate portion exposed through the opening using the resist pattern as a mask, a microstructure having protruding and depressed portions with a high aspect ratio can be formed at the substrate.

By using the X-ray mask in accordance with the present invention, especially in the method of forming a microstructure employing the LIGA method, after the resist is formed thick on the substrate, the X-ray absorber film can sufficiently intercept the X-rays of synchrotron orbital radiation, even when the X-rays are applied for a long time using the X-ray mask of the present invention on the resist layer. Therefore, by using the X-ray mask, the resist pattern having a higher aspect ratio can be formed easily as compared with the conventional X-ray mask used in manufacturing semiconductor integrated circuits.

Although the present invention has been described and illustrated in detail, it is clearly understood that the same is by way of illustration and example only and is not to be taken by way of limitation, the spirit and scope of the present invention being limited only by the terms of the appended claims.

We claim:

1. A method of forming a microstructure, comprising:

forming a resist layer having a thickness in the range from about 10 μm to about 1 mm on a substrate; and forming a resist pattern of said resist layer by lithography with synchrotron orbital radiation;

wherein said resist layer is formed of a resist material predominantly comprising a copolymer consisting of first units generally represented as

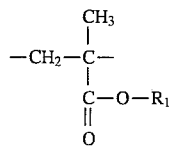

(where $R_1$ represents an alkyl group having one to four carbon atom(s) and a hydrogen atom of the alkyl group may be substituted for by a halogen atom) and second units generally represented as

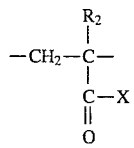

(where X represents a halogen atom or a hydroxyl group and $R_2$ represents a hydrogen atom or a methyl group).

2. The method of claim 1, further comprising depositing a metal by electroforming in accordance with said resist pattern.

3. The method of claim 1, further comprising selecting a particular wavelength for said synchrotron orbital radiation dependent on said thickness of said resist layer.

4. The method of claim 3, wherein said wavelength is in the range from about 2 Å to about 8 Å.

5. The method of claim 1, wherein said lithography with synchrotron orbital radiation is carried out to apply a total irradiation in the range from 30 mA·hour to 90 mA·hour.

6. The method of claim 1, wherein said microstructure has a thickness dimension in the range from 10 μm to about 100 μm.

7. The method of claim 1, wherein said step of forming said resist layer comprises bulk polymerizing said first units and said second units directly on said substrate in a stagnant layer.

8. The method of claim 7, wherein said step of forming said resist layer does not comprise spin coating.

9. The method of claim 1, wherein said resist material essentially consists of said copolymer.

10. A method of forming a microstructure, comprising:

forming a resist layer on a substrate; and patterning said resist layer;

wherein said step of forming said resist layer includes pre-polymerizing a first monomer generally represented as

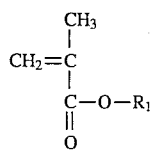

(where $R_1$ represents an alkyl group having one to four carbon atom(s) and a hydrogen atom of the alkyl group may be substituted for by a halogen atom), and a second monomer generally represented as

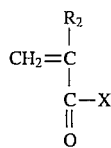

(where X represents a halogen atom or a hydroxyl group and $R_2$ represents a hydrogen atom or a methyl group) for preparing a copolymer syrup consisting of said first and second monomers, applying said copolymer syrup on said substrate, and fully polymerizing said copolymer syrup on said substrate.

11. The method of claim 10, wherein said step of patterning includes forming a resist pattern of said resist layer by lithography with synchrotron orbital radiation.

12. The method of claim 11, further comprising selecting a particular wavelength for said synchrotron orbital radiation in the range from about 2 Å to about 15 Å dependent on a thickness of said resist layer.

13. The method of claim 10, wherein said resist layer is formed to have a thickness in the range from about 10 μm to about 1 mm.

14. The method of claim 10, wherein said step of applying said copolymer syrup on said substrate comprises disposing and containing said syrup as a substantially stagnant layer on said substrate until said step of fully polymerizing said copolymer syrup is completed.

15. The method of claim 14, wherein said copolymer syrup does not comprise a solvent.

16. The method of claim 10, wherein said step of applying said copolymer syrup on said substrate does not comprise spin coating.

17. The method of claim 10, wherein said resist layer consists of a copolymer resulting from said full polymerization of said copolymer syrup.

18. A method of forming a microstructure, comprising:

forming a resist layer on a surface of a substrate;

forming of said resist layer a resist pattern having an opening, by lithography with synchrotron orbital radiation; and removing by etching a portion of said substrate exposed through said opening by using said resist pattern as a mask; wherein said step of forming said resist layer on said surface of said substrate includes pre-polymerizing a first monomer generally represented as

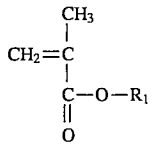

(where $R_1$ represents an alkyl group having one to four carbon atom(s) and a hydrogen atom of the alkyl group may be substituted for by a halogen atom), and a second monomer generally represented as

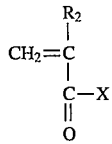

(where X represents a halogen atom or a hydroxyl group and $R_2$ represents a hydrogen atom or a methyl group) for preparing a copolymer syrup consisting of said first and second monomers, applying said copolymer syrup on said surface of said substrate, and fully polymerizing said copolymer syrup on said surface of said substrate.

19. The method of claim 18, wherein said resist layer is formed to have a thickness in the range from about 10 μm to about 1 mm.

20. The method of claim 18, wherein said step of applying said copolymer syrup on said surface of said substrate comprises disposing and containing said syrup as a substantially stagnant layer on said surface until said step of fully polymerizing said copolymer syrup is completed.

21. The method of claim 18, wherein said resist layer consists of a copolymer resulting from said full polymerization of said copolymer syrup.

22. An X-ray mask including an X-ray transmitting membrane consisting of a material that is transmissive to X-rays and an X-ray absorber film arranged on a surface of said X-ray transmitting membrane, wherein said X-ray absorber film has an average thickness of at least 5 μm.

* * * * *

UNITED STATES PATENT AND TRADEMARK OFFICE
CERTIFICATE OF CORRECTION

PATENT NO. : 5,527,646
DATED : June 18, 1996
INVENTOR(S) : Ogino et al.

It is certified that error appears in the above-identified patent and that said Letters Patent is hereby corrected as shown below:

Column 15, line 57, replace "5 Åm" by -- 5 μm --.

Signed and Sealed this

Tenth Day of September, 1996

Attest:

BRUCE LEHMAN

*Attesting Officer*　　*Commissioner of Patents and Trademarks*